(12) United States Patent
Pfaffinger et al.

(10) Patent No.: US 9,888,620 B2
(45) Date of Patent: Feb. 6, 2018

(54) ALLOCATION OF PRINTED CIRCUIT BOARDS ON FITTING LINES

(71) Applicant: SIEMENS AKTIENGESELLSCHAFT, München (DE)

(72) Inventors: Alexander Pfaffinger, München (DE); Christian Royer, Ottobrunn (DE)

(73) Assignee: Siemens Aktiengesellschaft, München (DE)

( * ) Notice: Subject to any disclaimer, the term of this patent is extended or adjusted under 35 U.S.C. 154(b) by 482 days.

(21) Appl. No.: 14/412,913

(22) PCT Filed: Apr. 24, 2013

(86) PCT No.: PCT/EP2013/058523
§ 371 (c)(1),
(2) Date: Jan. 5, 2015

(87) PCT Pub. No.: WO2014/005741
PCT Pub. Date: Jan. 9, 2014

(65) Prior Publication Data
US 2015/0195966 A1     Jul. 9, 2015

(30) Foreign Application Priority Data
Jul. 6, 2012    (DE) .................. 10 2012 211 814

(51) Int. Cl.
*G06F 19/00*     (2011.01)
*H05K 13/08*     (2006.01)
(Continued)

(52) U.S. Cl.
CPC ........... *H05K 13/08* (2013.01); *G05B 19/418* (2013.01); *H05K 13/0061* (2013.01); *G05B 2219/45032* (2013.01)

(58) Field of Classification Search
None
See application file for complete search history.

(56) References Cited

U.S. PATENT DOCUMENTS 5,258,915 A    11/1993  Billington et al.
8,793,008 B2    7/2014  Bauer et al.
(Continued)

FOREIGN PATENT DOCUMENTS

CN    1606903 A    4/2005
CN  102356707 A    2/2012
(Continued)

OTHER PUBLICATIONS

Chinese office Action for related Chinese Application No. 201380036046.2 dated Jul. 5, 2016 with English Translation.
(Continued)

*Primary Examiner* — Wissam Rashid
(74) *Attorney, Agent, or Firm* — Lempia Summerfield Katz LLC

(57) ABSTRACT

A fitting system is provided that includes a plurality of fitting lines for fitting printed circuit boards with electronic components. A method for allocating printed circuit boards to the fitting lines includes: (1) determining requirements for fitting each of a plurality of printed circuit boards with allocated components; and (2) allocating the printed circuit boards to fitting lines under predetermined conditions by integral linear programming. Equipment families are determined for the fitting lines on the basis of the allocation, and the allocation is repeated until a criterion has reached a predetermined threshold. The criterion is established on the basis of the number of equipment families of the fitting lines, where an equipment family includes a quantity of different components with which a fitting line may be fitted in order to fit a predetermined amount of printed circuit boards.

20 Claims, 3 Drawing Sheets

(51) Int. Cl.
    *G05B 19/418*     (2006.01)
    *H05K 13/00*     (2006.01)

(56) References Cited

U.S. PATENT DOCUMENTS

| | | |
|---|---|---|
| 2004/0143352 A1 | 7/2004 | Gyorfi et al. |
| 2004/0143963 A1 | 7/2004 | Mehdianpour et al. |
| 2012/0004762 A1* | 1/2012 | Bauer .................... H05K 13/08 700/219 |

FOREIGN PATENT DOCUMENTS

| | | |
|---|---|---|
| DE | 102009013353 B3 | 10/2010 |
| EP | 0478360 A1 | 4/1992 |
| EP | 0478361 A1 | 4/1992 |
| JP | H04257968 A | 9/1992 |
| JP | H05138467A A | 6/1993 |
| JP | 2005093849A A | 4/2005 |
| JP | 2006253184A A | 9/2006 |

OTHER PUBLICATIONS

PCT International Search Report dated Nov. 20, 2013 for corresponding PCT/EP2013/058523 with English translation.
Mitteilung des Europäischen Patentamts vom 1. Oct. 2007 über Geschäftsmethoden; Amtsblatt EPA;Nov. 2007; pp. 592-593; 2007; Nov. 1, 2007.
English translation of Japanese Office action for related Japanese Application No. 2015-518906 dated Jan. 25, 2016.
Japanese Office Action for related Japanese Application No. 2017-011958 dated Oct. 26, 2017.

\* cited by examiner

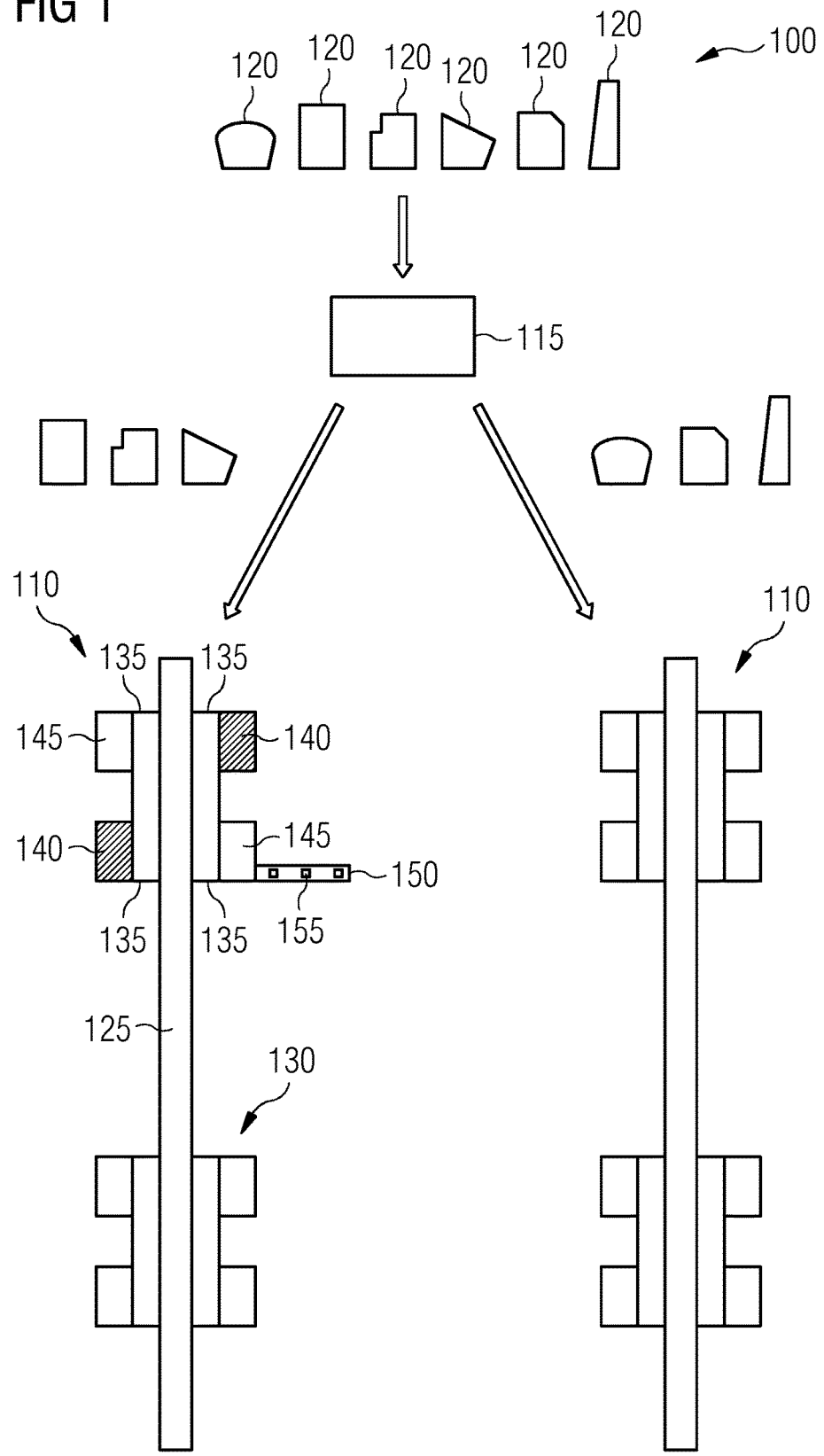

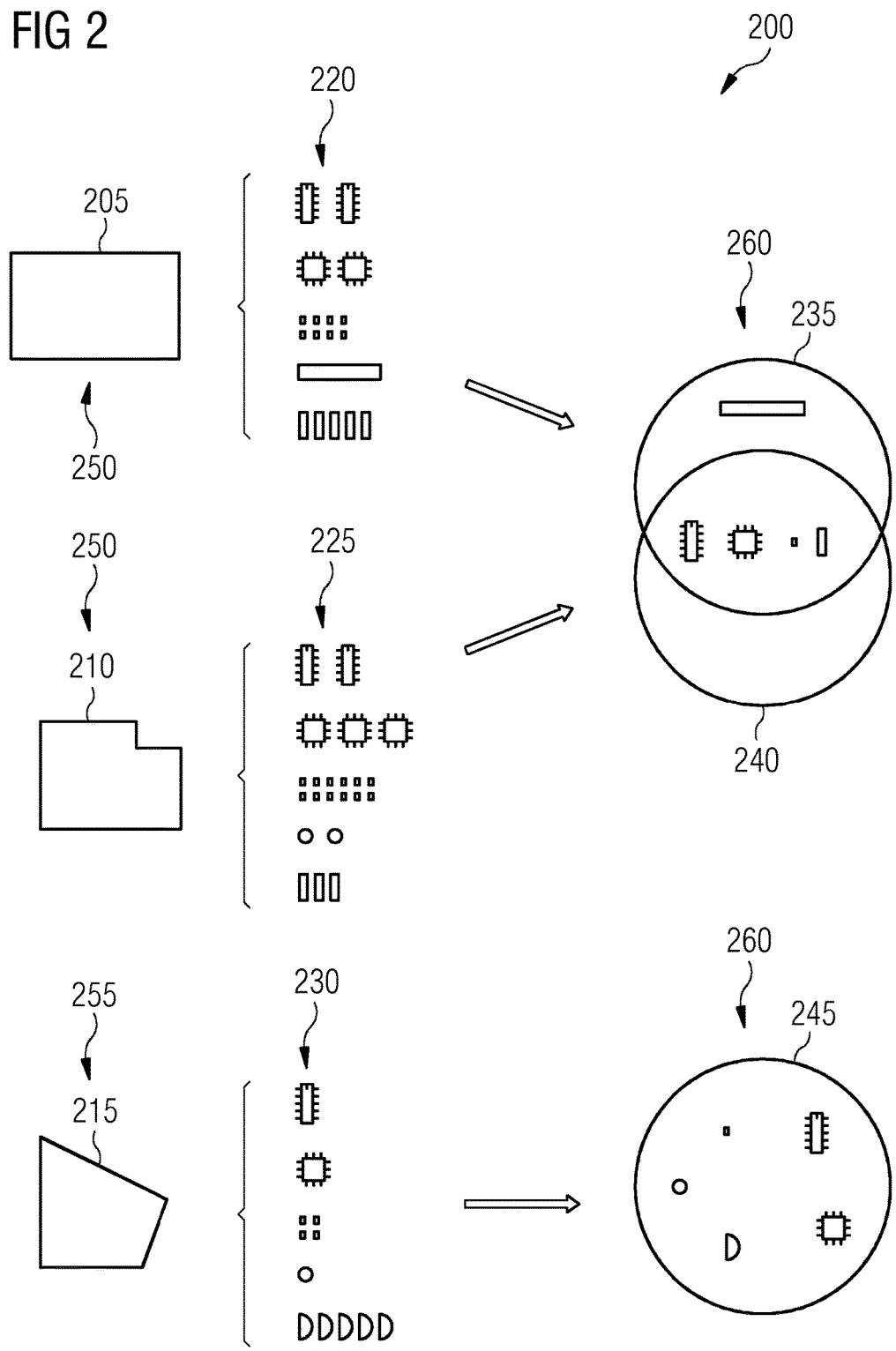

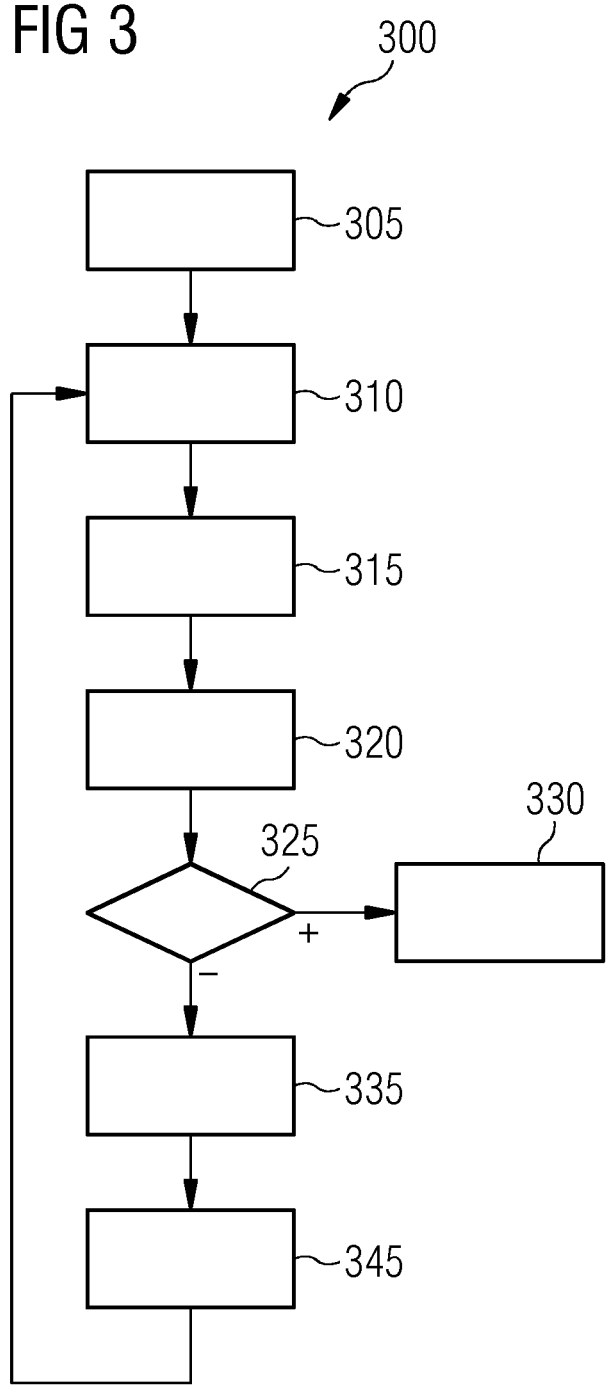

ALLOCATION OF PRINTED CIRCUIT BOARDS ON FITTING LINES

CROSS-REFERENCE TO RELATED APPLICATIONS

The present patent document is a § 371 nationalization of PCT Application Serial Number PCT/EP2013/058523, filed Apr. 24, 2013, designating the United States, which is hereby incorporated by reference, and this patent document also claims the benefit of DE 10 2012 211 814.4, filed on Jul. 6, 2012, which is also hereby incorporated by reference.

TECHNICAL FIELD

The present embodiments relate to a method for allocating printed circuit boards on fitting lines for fitting the printed circuit boards or other subassemblies with components. The embodiments also relate to a control device for a production or assembly line for fitting printed circuit boards with components. The embodiments also relate to a computer program product and to a computer-readable medium.

BACKGROUND

In the field of electronics production, in particular, printed circuit boards or subassemblies to be produced are produced on surface mounted technology (SMT) fitting lines by surface mounting. On account of technical restrictions, however, not every printed circuit board may be produced on every fitting line. The printed circuit boards also may have different production times on the fitting lines. In addition, the maximum production time capacities of the fitting lines is not exceeded.

DE 10 2009 013 353 B3 shows a method for equipping such a fitting line.

Printed circuit boards on fitting lines of a fitting system may be allocated manually or semi-automatically on the basis of empirical values or heuristics. In this case, it has been shown in practice that unbalanced allocations are being made again and again, which cause high utilization of one component of a fitting line with low utilization of another component, with the result that the fitting system may not be used in an optimal manner.

SUMMARY AND DESCRIPTION

The scope of the present invention is defined solely by the appended claims and is not affected to any degree by the statements within this summary. The present embodiments may obviate one or more of the drawbacks or limitations in the related art.

The object of the present embodiments is to provide an improved technique for allocating printed circuit boards on fitting lines.

A fitting system includes a plurality of fitting lines for fitting printed circuit boards with electronic components. A method for allocating printed circuit boards to the fitting lines includes acts of detecting requirements for fitting a plurality of printed circuit boards with respectively allocated components and allocating the printed circuit boards to fitting lines under predetermined specifications by integer linear programming. Equipment families for the fitting lines are determined on the basis of the allocation and the allocation is repeated until a criterion has reached a predetermined threshold. The criterion is formed on the basis of the numbers of equipment families of the fitting lines.

In this case, an equipment family is determined as a set of printed circuit boards that may be fitted with components on a fitting line without changing the set of component types that are kept ready at the fitting line for fitting. The set of component types kept ready at the fitting line is also called equipment. A sufficiently large number of components of each component type may be kept ready at the fitting line.

More printed circuit boards than may be included in an equipment family may be allocated to a fitting line since an arbitrary number of component types may not be kept ready at the fitting line. The fitting line is therefore occasionally subjected to an equipment change in which the equipment for a first equipment family is exchanged for the equipment for a second equipment family. The rarer these equipment changes are and the fewer component types that have to be exchanged during an equipment change, the more cost-effectively the fitting system may be operated.

It has been shown that the total number of equipment families used in the fitting system may be a more realistic quality indicator than component variance of a fitting line, for example. In this case, the component variance of a fitting line is given by the number of different components that are fitted to one of the printed circuit boards allocated to the fitting line. The method may therefore determine allocations of printed circuit boards to fitting lines that allow improved utilization of the entire fitting system.

In addition, the method may be flexibly configured to actual conditions or desires of an operator of the fitting system. A global optimization approach may be achieved by using integer linear programming. It is possible to extend the method. Runtime environments for carrying out an optimization by integer linear programming are available in the form of commercial products, for example, Ilog or Xpress. Such so-called standard solvers are continuously being improved, with the result that it may be expected that the allocation using the described method will be able to be carried out even more quickly and/or with further optimization in future.

The described method may allow a very good allocation of printed circuit boards to fitting lines within a relatively short runtime. The method may provide improved results with respect to the quality of the results or the required runtime in comparison with other optimization approaches. In addition, the method may be used to find allocations of printed circuit boards to fitting lines that allow balanced numbers of equipment families and the formation of an increased number of constant shuttle tables.

In order to determine the equipment families, a method that is separate from the integer linear programming may be called. The separation of integer linear programming and determination of the assessment criterion makes it possible to avoid the situation in which the integer linear programming has to process an excessively complex allocation problem and therefore either needs a long time in order to create an allocation or the created solution is less effective.

If the solver is sufficiently powerful, the allocation may also be carried out, in another embodiment, directly with respect to minimizing the number of equipment families for the fitting lines by integer linear programming.

In one embodiment, the criterion includes the condition that the number of equipment families of each fitting line is greater than a predetermined threshold. Convergence of the optimization by integer linear programming may be accelerated thereby.

In another embodiment, the criterion includes the condition that the number of equipment families of each fitting line is less than a predetermined threshold. An excessively high utilization of one of the fitting lines may be prevented thereby.

In different variants, one or both of the above-mentioned predetermined thresholds may be individually predetermined for one or more of the fitting lines. This makes it possible to take into account an empirical value per se as a threshold that has proved to be useful.

In one embodiment, the criterion includes the condition that differences between the numbers of equipment families of each fitting line are below a predetermined threshold. An allocation of printed circuit boards to fitting lines may therefore be optimized to the effect that the fitting lines have the same numbers of equipment families as far as possible. A compromise between high allocation quality and the method runtime may be chosen in an improved manner by increasing or decreasing the predetermined threshold. In one embodiment, the threshold may also be zero. In another embodiment, the criterion may also include a quantified difference between the numbers of equipment families of the individual fitting lines. In this case, the allocation of printed circuit boards to fitting lines may also be optimized with respect to the smallest possible difference in repeated iterations of the method.

In another embodiment, the allocation of printed circuit boards in an equipment family to a fitting line is prevented if the equipment family is allocated a small number of printed circuit boards or a small track consumption. For the number of printed circuit boards and the track consumption, it is possible to respectively state a threshold below that the respective value is recognized as "low". Devices that are intended to stockpile different components at a fitting line in this case include a predetermined number of tracks that may be each 8 mm wide. This makes it possible to force a reallocation of printed circuit boards in the relevant equipment family to another fitting line.

In a similar manner, an allocation of a printed circuit board to a fitting line may also be fixed by virtue of a change in an allocation that has already been made being prevented if the corresponding equipment family is allocated a large number of printed circuit boards or a high track consumption. In this case too, it is possible to state threshold values above which the respective value is recognized as "high". The optimization of the allocation of printed circuit boards to fitting lines may be accelerated or improved thereby.

A computer program product includes a program code for carrying out the described method if the computer program product runs on an execution device or is stored on a computer-readable medium. The computer program product may be created in a conventional programming language (for example, C++, Java). The processing device may include a commercially available computer or server with corresponding inputs, outputs, and storage.

A control device for allocating printed circuit boards to fitting lines of a fitting system is set up to carry out the method described above.

BRIEF DESCRIPTION OF THE DRAWINGS

FIG. 1 depicts one embodiment of a fitting system.
FIG. 2 depicts an embodiment of equipment families in the fitting system from FIG. 1.
FIG. 3 depicts an embodiment of a flowchart of an optimization method using integer linear programming.

DETAILED DESCRIPTION

Linear optimization is one of the main methods in the field of mathematical optimization and deals with the optimization of linear target functions over a set that is restricted by linear equations and inequalities. Linear optimization is the basis of the solution methods of (e.g., mixed) integer linear optimization.

Advantages of linear optimization include the following features: (1) global optimization approach; (2) easily expandable, (3) good commercial standard solvers (e.g., SCIP, CPLEX, Ilog, Xpress), which are widespread and proven in practice; and (4) for a determined solution, it is known how far away it is at most from the optimal solution (e.g., gap).

FIG. 1 depicts a fitting system 100. The fitting system 100 includes a plurality of fitting lines 110 and a control device 115 for allocating printed circuit boards 120 to the fitting lines 110. Each fitting line 110 may include a transport system 125 and one or more fitting machines 130. Each fitting machine 130 includes one or more fitting heads 135 that are each set up to receive components from a constant table 140 or a variable table 145 and to position them at a predetermined position on the printed circuit board 120 that is on the transport system 125.

During the fitting process, the printed circuit board 120 may be still with respect to the fitting machine 130. The tables 140, 145 each include a multiplicity of feeding devices 150, only one of which is illustrated by way of example. Each feeding device 150 keeps a supply of components 155 of a predetermined type ready. Although each feeding device 150 may be configured to keep different components 155 ready and different feeding devices 150 are fitted to a table 140, 145, the tables 140, 145 may be completely exchanged for reasons of speed if a fitting machine 130 is supplied with components 155 that are not kept on one of the fitted tables 140, 145.

Since such a change may be associated with a production standstill, the aim is to keep the number of tables 140, 145 to be changed low. If a table is not exchanged during a conversion process, it is referred to as a constant table 140, otherwise it is referred to as a variable table 145. Otherwise, there are no functional differences between a constant table 140 and a variable table 145.

The printed circuit board 120 is to be fitted with a number of different components 155. In order to minimize frequent changing of variable tables 145 and ideally to maximize a number of constant tables 140, the control device 115 is set up to optimize the allocation of a printed circuit board 120 to one of the fitting lines 110. In this case, specific properties of each fitting line 110 and of each fitting machine 130 may be taken into account just like properties of the printed circuit boards 120 and of the components 155 to be fitted on the latter.

FIG. 2 depicts an illustration 200 of equipment families, which are also called "clusters". A first printed circuit board 205, a second printed circuit board 210, and a third printed circuit board 215, which each correspond to one of the printed circuit boards 120 in the fitting system 100 from FIG. 1, are considered. The first printed circuit board 205 is allocated a first set 220 of components 155, the second printed circuit board 210 is allocated a second set 225 of components 155, and the third printed circuit board 215 is allocated a third set 230 of components 155. In an exemplary manner, the sets 220 to 230 each include five different component types, of which components 155 are used in different numbers. Components 155 of one component type may not be distinguished from one another within the scope of the method 200 being considered. The sets 220 to 230 of components 155 are therefore allocated sets 235 to 245 of component types. Each of the components 155 in the allocated set 220 to 230 occurs only once in the sets 235 to 245.

An equipment family includes those printed circuit boards 120 that are allocated for being fitted with components on a fitting line 100. In the example from FIG. 2, the printed circuit boards 205 and 210 are allocated to the same fitting line 110 and form a first equipment family 250. The first equipment family 250 therefore requires first equipment 260 with component types of the combination set of the sets 235 and 240 that are allocated to the printed circuit boards 205 and 210. In the example illustrated, the first equipment 260 includes six component types. With the provision of the component types of the first equipment 260, the printed circuit boards 205 and 210 in the first equipment family 250 may be fitted on the fitting line 110 without conversion.

The third printed circuit board 215 is allocated to a different fitting line 110 and alone forms a second equipment family 255. Second equipment 265 allocated to the second equipment family 255 includes five component types.

If the sets 220 and 225 include many components 155 of the same component type, the first equipment 260 only includes a small number of different component types. An attempt may be made to allocate the printed circuit boards 120 to equipment families 250, 255 in such a manner that as many different printed circuit boards 120 as possible may be processed with the fitting line 110.

The third printed circuit board 215 is allocated to a different fitting line 110 and alone forms a second equipment family 255. Second equipment 265 allocated to the second equipment family 255 includes five component types.

If the third printed circuit board 215 was allocated to the same equipment family as the printed circuit boards 205 and 210, the equipment allocated to the resulting equipment family would contain the component types of the combination set of the sets 235 to 245, that is to say seven component types in the present example. If the fitting line 110 has only receiving capacities for six different components 155, for example, the equipment family formed in this manner may not be allocated to the fitting line 110 and the third printed circuit board 215 no longer fits in the equipment family allocated to the fitting line 110.

An equipment change is required in order to fit printed circuit boards 120 in another equipment family with components on the fitting line 110. In this case, one or more feeding elements, (in particular, a variable table 145 or a conveyor 150), may be changed on a fitting machine 130 of the fitting line 110.

The number of equipment changes may be reduced and a number of constant tables 140 may be increased by reducing the number of equipment families 250, 255 of the fitting line 110. This may be achieved by skillful allocation of the printed circuit boards 120 to the equipment families 250, 255. The optimization of the allocation of printed circuit boards 120 to the equipment families 250, 255 is explained in more detail below with reference to FIG. 3.

A method 300 for allocating printed circuit boards 120 to fitting lines 110 is illustrated in the form of a flowchart in FIG. 3.

At act 305, a starting allocation of printed circuit boards 120 on fitting lines 110 is determined and a current allocation is equated with the starting allocation. Different heuristics that may also include manual specifications or restrictions are possible for determining the starting allocation.

At act 310, a subset of printed circuit boards 120 is selected from the printed circuit boards 120 to be allocated. This selection may be made in such a manner that different subsets are selected during successive runs through the method 300.

At act 315, one or more alternative allocations of printed circuit boards 120 in the subset to the fitting lines 110 are formed, (e.g., using integer linear programming). These allocations are made with respect to FIG. 2 in such a manner that the sum of the numbers of equipment families 250, 255 is minimized across all fitting lines 110. A weighted criterion of a plurality of individual criteria may also be used for the allocation, with the result that yet further parameters may also be minimized or maximized as far as possible in order to achieve an optimized allocation.

At act 320, in this case, the quality of the determined allocations is determined by forming an individual or combined criterion. The criterion is formed on the basis of a number of equipment families for the fitting lines 110. In one embodiment, a method that is separate from the integer linear programming is called for this purpose, which method first of all forms the equipment families for the fitting lines on the basis of the determined allocation and then forms the sum of the determined equipment families over all fitting lines 110.

In yet another embodiment, the criterion may include the compliance with a predetermined condition. For example, the condition may include the fact that the number of equipment families of each fitting line 110 is greater or less than a predetermined threshold, the threshold respectively being able to be individually allocated to a fitting line 110. If the condition has been met, the criterion may be set to a first predetermined value, otherwise it may be set to a second value. It is therefore possible to prevent an allocation from being accepted if the condition has not been met.

In further embodiments, it may also be required as a condition that differences between the numbers of equipment families of each fitting line 110 are below a predetermined threshold. This threshold may be zero, in particular. In one variant, the differences may also be expressed in a quantified manner as a criterion, with the result that the method 300 may carry out optimization with respect to the criterion.

In further embodiments, the criterion may be composed of a plurality of individual criteria that may be added together or multiplied by one another using weighting factors to form an overall criterion. For example, individual criteria may relate to one or more of the above-mentioned criteria, a degree of utilization of a fitting machine 130, the ratio of constant tables 140 to variable tables 145 or a degree of utilization of a fitting machine 130.

At act 325, a check is then carried out in order to determine whether a predetermined abort criterion has been reached. The abort criterion has been satisfied if the criterion or the overall criterion from act 320 has reached a predetermined threshold value. The allocation may also be aborted if a predetermined determination time for the method 300 has expired. This makes it possible to prevent endless optimization of the allocation.

At act 330, the determined allocations are output if the abort criterion has been satisfied.

At act 335, otherwise, those allocations from the determined allocations that are intended to be optimized further may be selected. For example, the allocation determined last may be dropped in favor of an allocation determined in a previous run if the older allocation has a better criterion or overall criterion.

At act 340, in this case, the current allocation is set to one of the allocations to be optimized and the method 300 may run through again from act 310. If a plurality of allocations that may be optimized have been selected, the method 300 may also be accordingly branched repeatedly in a parallel manner.

Mathematical Background

The use of exact mathematical methods makes it possible to achieve considerably better solutions than with heuristics previously used in practice. In further contrast thereto, good production times may also be achieved with these methods.

When allocating printed circuit boards 120 or subassemblies to a fitting line 110, not every printed circuit board 120 may be produced on every fitting line 110 on account of technical restrictions. The printed circuit boards may also have different production times on the fitting lines 110. In addition, the maximum production time capacities of the fitting lines 110 is not exceeded.

When allocating printed circuit boards 120 on fitting lines 110, the following aims may be pursued: (1) as many printed circuit boards 120 as possible may be able to be produced using constant tables 140 in order to reduce the conversion effort; (2) the number of equipment families ("clusters") on the fitting lines 110 may be as small as possible in order to reduce the amount of conversion time; (3) as little equipment as possible (for example conveyor 150) may be required; and (4) the total production time for the printed circuit boards 120 may be as minimal as possible.

An attempt may be made to achieve these aims by striving for the best possible component coverage of the printed circuit boards 120 of a fitting line 110 or minimizing the sum of component variances of the fitting lines 110.

IP models (IP stands for integer programming or integer program or integer optimization model) are used to determine an optimized allocation of printed circuit boards 120 to fitting lines 110. This determination may be carried out using a known standard solver.

Indices
L Set of SMT fitting lines 110 of the system 100
R Set of printed circuit boards 120
C Set of component types 155
$R_c$ Set of printed circuit boards with component type c
$R_l$ Set of printed circuit boards that may be fitted with components on line l Parameters
$Time_{r,l}$ Total production time for printed circuit board r on line l
$TimeLimit_l$ Production time limit on line l Binary Variables
$Assign_{r,l}$ Allocation of printed circuit board r to line l
$Setup_{c,l}$ Use of a component c on a line l IP Formulation $$\text{minimize} \sum_{c \in C} \sum_{l \in L} Setup_{c,l}$$

s.t.:

$$\sum_{l \in L} Assign_{r,l} = 1 \quad r \in R$$

$$Assign_{r,l} = 0 \quad l \in L, r \in R/R_l$$

$$\sum_{r \in R_c} Assign_{r,l} \leq Setup_{c,l} |R_c| \quad c \in C, l \in L$$

$$\sum_{r \in R} Assign_{r,l} Time_{r,l} \leq TimeLimit_l \quad l \in L$$

$$Setup_{c,l} \in \{0, 1\} \quad c \in C, l \in L$$

$$Assign_{r,l} \in \{0, 1\} \quad r \in R, l \in L$$

In order to improve the allocation of printed circuit boards 120 to fitting lines 110, the solver may be provided with conditions. The conditions imposed are aimed at optimizing the allocation of printed circuit boards 120 on the fitting lines 110 in such a manner that the sum of the numbers of equipment families of all fitting lines 110 of the fitting system 100 is minimized.

Using this specification makes it possible to achieve an improved distribution of the printed circuit boards 120 across the fitting lines 110, in which case balanced sizes of equipment families may be achieved. The fitting system 100 may therefore be operated with improved efficiency or utilization. In addition, the allocations may be determined more quickly than previously known with the described approach using an IP solver.

Although the invention was illustrated and described more specifically in detail by the exemplary embodiments, the invention is not restricted by the disclosed examples and other variations may be derived therefrom by a person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for allocating printed circuit boards to fitting lines of a fitting system for fitting the printed circuit boards with electronic components, the method comprising:
    detecting requirements for fitting a plurality of printed circuit boards with respectively allocated electronic components;
    allocating a subset of the printed circuit boards to fitting lines under predetermined specifications by integer linear programming;
    determining equipment families for the fitting lines on a basis of the allocation of the subset of the printed circuit boards; and
    carrying out a new allocation of a subset of the printed circuit boards until a criterion has reached a predetermined threshold, the criterion being formed on a basis of a number of equipment families of the fitting lines,
    wherein the criterion comprises a condition that: (1) the number of equipment families of each fitting line is greater than a respective predetermined threshold, (2) the number of equipment families of each fitting line is less than the respective predetermined threshold, or (3) differences between the number of equipment families of each fitting line are below the respective predetermined threshold.

2. The method as claimed in claim 1, wherein the condition is that the number of equipment families of each fitting line is greater than the respective predetermined threshold.

3. The method as claimed in claim 2, wherein the allocation of printed circuit boards in an equipment family to a fitting line is prevented when the equipment family is allocated less than a threshold number of printed circuit boards or less than a threshold track consumption.

4. The method as claimed in claim 2, wherein a change in the allocation of printed circuit boards of an equipment family to a fitting line is prevented when the equipment family is allocated greater than a threshold number of printed circuit boards or greater than a threshold track consumption.

5. The method as claimed in claim 1, wherein the condition is that the number of equipment families of each fitting line is less than the respective predetermined threshold.

6. The method as claimed in claim 5, wherein one of the predetermined thresholds is able to be individually predetermined for at least one of the fitting lines.

7. The method as claimed in claim 5, wherein the allocation of printed circuit boards in an equipment family to a fitting line is prevented when the equipment family is allocated less than a threshold number of printed circuit boards or less than a threshold track consumption.

8. The method as claimed in claim 5, wherein a change in the allocation of printed circuit boards of an equipment family to a fitting line is prevented when the equipment family is allocated greater than a threshold number of printed circuit boards or greater than a threshold track consumption.

9. The method as claimed in claim 2, wherein one of the predetermined thresholds is able to be individually predetermined for at least one of the fitting lines.

10. The method as claimed in claim 1, wherein the condition is that the differences between the number of equipment families of each fitting line are below the respective predetermined threshold.

11. The method as claimed in claim 1, wherein the allocation of printed circuit boards in an equipment family to a fitting line is prevented when the equipment family is allocated less than a threshold number of printed circuit boards or less than a threshold track consumption.

12. The method as claimed in claim 11, wherein a change in the allocation of printed circuit boards of an equipment family to a fitting line is prevented when the equipment family is allocated greater than the threshold number of printed circuit boards or greater than the threshold track consumption.

13. The method as claimed in claim 1, wherein a change in the allocation of printed circuit boards of an equipment family to a fitting line is prevented when the equipment family is allocated greater than a threshold number of printed circuit boards or greater than a threshold track consumption.

14. A computer program product with a program code on an execution device or stored on a computer-readable medium, the program code, when executed on the execution device, is configured to:
  detect requirements for fitting a plurality of printed circuit boards with respectively allocated components;
  allocate a subset of the printed circuit boards to fitting lines under predetermined specifications by integer linear programming;
  determine equipment families for the fitting lines on a basis of the allocation of the subset of the printed circuit boards; and
  carry out a new allocation of a subset of the printed circuit boards until a criterion has reached a predetermined threshold, the criterion being formed on a basis of a number of equipment families of the fitting lines,
  wherein the criterion comprises a condition that: (1) the number of equipment families of each fitting line is greater than a respective predetermined threshold, (2) the number of equipment families of each fitting line is less than the respective predetermined threshold, or (3) differences between the number of equipment families of each fitting line are below the respective predetermined threshold.

15. The computer program product as claimed in claim 14, wherein the condition is that the number of equipment families of each fitting line is greater than the respective predetermined threshold.

16. The computer program product as claimed in claim 15, wherein one of the predetermined thresholds is able to be individually predetermined for at least one of the fitting lines.

17. The computer program product as claimed in claim 14, wherein the condition is that the number of equipment families of each fitting line is less than the respective predetermined threshold.

18. The computer program product as claimed in claim 17, wherein one of the predetermined thresholds is able to be individually predetermined for at least one of the fitting lines.

19. The computer program product as claimed in claim 14, wherein the condition is that differences between the number of equipment families of each fitting line are below the respective predetermined threshold.

20. A control device for allocating printed circuit boards to fitting lines of a fitting system, the control device configured to:
  detect requirements for fitting a plurality of printed circuit boards with respectively allocated components;
  allocate a subset of the printed circuit boards to fitting lines under predetermined specifications by integer linear programming;
  determine equipment families for the fitting lines on a basis of the allocation of the subset of the printed circuit boards; and
  carry out a new allocation of a subset of the printed circuit boards until a criterion has reached a predetermined threshold, the criterion being formed on a basis of the number of equipment families of the fitting lines,
  wherein the criterion comprises a condition that: (1) the number of equipment families of each fitting line is greater than a respective predetermined threshold, (2) the number of equipment families of each fitting line is less than the respective predetermined threshold, or (3) differences between the number of equipment families of each fitting line are below the respective predetermined threshold.

* * * * *